(12) United States Patent
Tajima et al.

(10) Patent No.: US 8,391,083 B2
(45) Date of Patent: Mar. 5, 2013

(54) SEMICONDUCTOR DEVICE CAPABLE OF DETECTING DEFECT OF COLUMN SELECTION LINE

(75) Inventors: Shingo Tajima, Tokyo (JP); Yoshihumi Mochida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 139 days.

(21) Appl. No.: 12/926,996

(22) Filed: Dec. 22, 2010

(65) Prior Publication Data

US 2011/0158004 A1 Jun. 30, 2011

(30) Foreign Application Priority Data

Dec. 24, 2009 (JP) ................................ 2009-292959

(51) Int. Cl.
*G11C 16/04* (2006.01)
(52) U.S. Cl. ............... 365/189.07; 365/189.04; 365/200
(58) Field of Classification Search ............. 365/189.07, 365/189.04, 200, 201, 49.17
See application file for complete search history.

(56) References Cited

U.S. PATENT DOCUMENTS

| 6,529,438 B1 * | 3/2003 | Suzuki et al. ................. 365/201 |
| 6,543,017 B1 | 4/2003 | Arai |
| 6,819,608 B2 * | 11/2004 | Watanabe ..................... 365/200 |

FOREIGN PATENT DOCUMENTS

JP 2000-132998 A 5/2000

* cited by examiner

*Primary Examiner* — David Lam
(74) *Attorney, Agent, or Firm* — McGinn IP Law Group, PLLC

(57) ABSTRACT

To include a comparison circuit that generates comparison results by comparing plural pieces of data simultaneously read via data lines with expected values, an AND gate that activates a first determination signal in response to a fact that at least one of the comparison results indicates a mismatch, and an OR gate that activates a second determination signal in response to a fact that all the comparison results indicate a mismatch. With this arrangement, when a detection test of a defective address is performed in a wafer state, a defect of a column selection line can be detected.

20 Claims, 9 Drawing Sheets

|     | C10 | C11 | C12 | C13 |
|-----|-----|-----|-----|-----|
| WL0 | L   | L   | L   | H   |
| WL1 | H   | H   | L   | L   |
| WL2 | L   | H   | H   | L   |
| WL3 | L   | H   | H   | H   |

FIG.9A

|     | C10 | C11 | C12 | C13 |
|-----|-----|-----|-----|-----|
| WL0 | H   | H   | H   | H   |
| WL1 | L   | L   | L   | L   |
| WL2 | L   | L   | L   | L   |
| WL3 | L   | L   | L   | L   |

FIG.9B

|     | C10 | C11 | C12 | C13 |
|-----|-----|-----|-----|-----|
| WL0 | L   | L   | L   | L   |
| WL1 | H   | H   | L   | L   |
| WL2 | L   | H   | H   | L   |
| WL3 | L   | H   | H   | L   |

FIG.9C

|     | C10 | C11 | C12 | C13 |
|-----|-----|-----|-----|-----|
| WL0 | H   | L   | H   | H   |
| WL1 | H   | L   | H   | H   |
| WL2 | H   | L   | H   | H   |
| WL3 | H   | L   | H   | H   |

FIG.9D

SEMICONDUCTOR DEVICE CAPABLE OF DETECTING DEFECT OF COLUMN SELECTION LINE

BACKGROUND OF THE INVENTION

1. Field of the Invention

The present invention relates to a semiconductor device, and more particularly relates to a semiconductor device capable of detecting a defect of a column selection line.

2. Description of Related Art

A semiconductor memory represented by DRAM (Dynamic Random Access Memory) is subjected to various operation tests at a manufacturing stage. As one of most important tests among these, there is a detection test of a defective address performed in a wafer state. Most of defective addresses are caused by a defect of a word line or a bit line. Therefore, detected defective addresses can be relieved by replacing the defective line with an auxiliary word line or auxiliary bit line.

However, although it is rare, among defective addresses, some defects are caused by a defect of a column selection line. When there is a defect in a column selection line, all bit lines that may be selected by this column selection line become defective. Therefore, a chip having such a defect basically needs to be discarded.

In a detection test of a defective address, a comparison result is compressed within a chip to shorten a testing time (see Japanese Patent Application Laid-open No. 2000-132998). Compressing a comparison result means to arrange plural comparison results obtained by comparing plural pieces of read data with an expected value, into a one-bit compressed determination signal. When the determination signal indicates a defect, it is recognized that at least one bit of corresponding plural pieces of read data does not match the expected value. This means that how many bits of read data do not match the expected value cannot be known at this stage, even when the determination signal indicates a defect. Consequently, as a typical example, when plural bits of read data are collectively defective such as when there is a defect in a column selection line, this defect cannot be distinguished from a normal bit-line defect even when all bits of data read by the column selection line are defective.

Because a chip having a defect in a column selection line cannot have an address correctly relieved even when a bit line is replaced, the chip is eliminated in a selection test after packaging. Consequently, although the chip will not be mistakenly shipped as a good product, its packaging cost becomes wasteful.

The above problem can occur in all semiconductor devices having a memory area, not only in a semiconductor memory such as a DRAM.

SUMMARY OF THE INVENTION

In one embodiment, there is provided a semiconductor device that includes: a comparison circuit that generates a plurality of comparison results that correspond to plural pieces of read data by comparing the data simultaneously read via a plurality of data lines with an expected value; a first determining circuit that activates a first determination signal in response to a fact that at least one of the comparison results indicates a mismatch; and a second determining circuit that activates a second determination signal in response to a fact that all the comparison results indicate a mismatch.

In another embodiment, there is provided a semiconductor device that includes: at least one word line; a plurality of memory cells selected by the word line; a plurality of bit lines connected to the memory cells, respectively; a plurality of data lines; a plurality of column switches that connect the bit lines and the data lines; a column selection line that supplies a column selection signal in common to the column switches; and a determining circuit that determines a defect of the column selection line by evaluating plural pieces of data read from the memory cells by activating the word line and the column selection signal.

According to the present invention, when a detection test of a defective address is performed in a wafer state, a defect of a column selection line can be detected. Therefore, because a chip having an unrelievable defect can be discarded before packaging, unnecessary costs can be deleted.

BRIEF DESCRIPTION OF THE DRAWINGS

The above features and advantages of the present invention will be more apparent from the following description of certain preferred embodiments taken in conjunction with the accompanying drawings, in which:

FIGS. 9A to 9D are diagrams showing examples of changing patterns of comparison results when word lines are sequentially selected.

DETAILED DESCRIPTION OF THE EMBODIMENTS

Preferred embodiments of the present invention will be explained below in detail with reference to the accompanying drawings.

Figure 1:
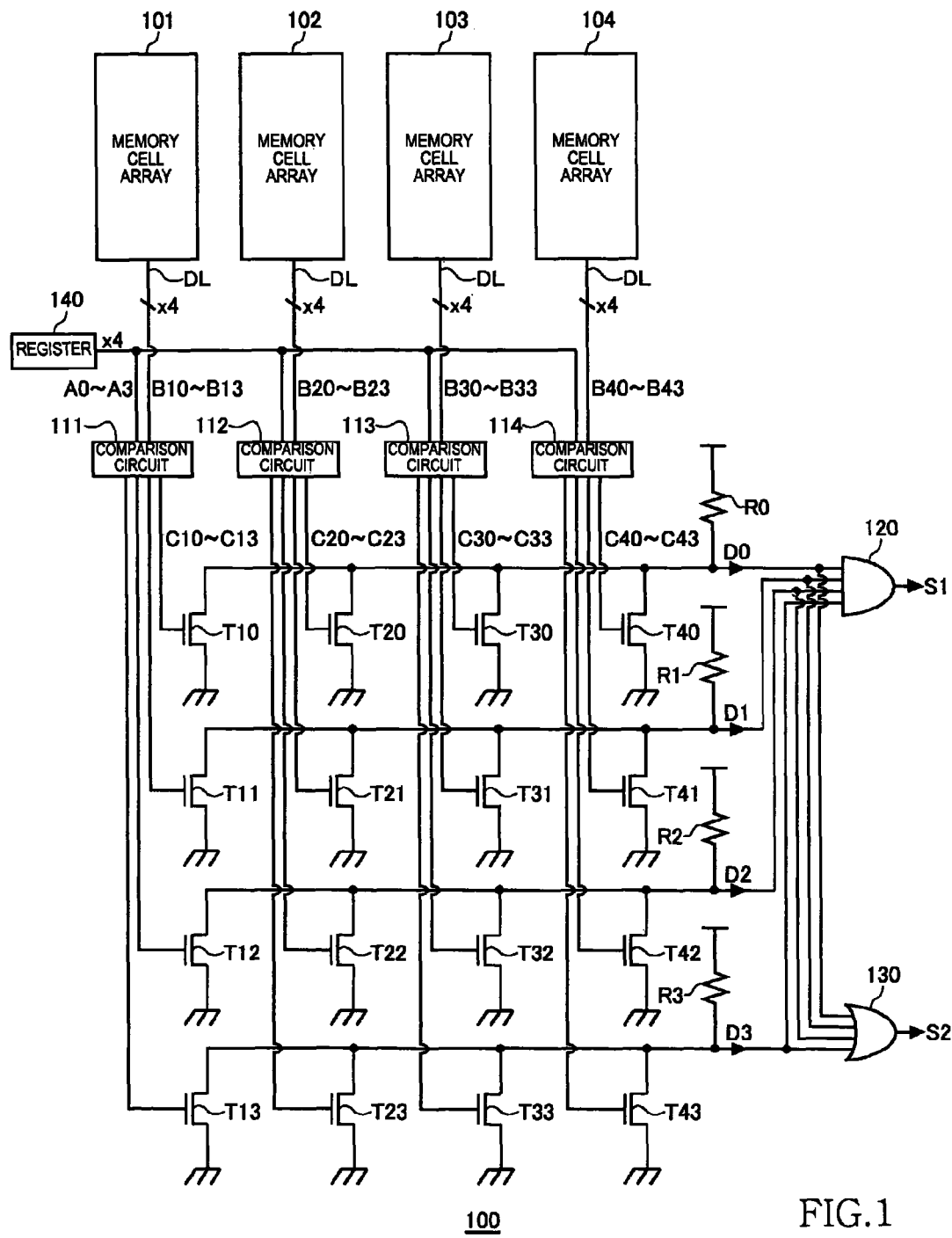
FIG. 1 is a circuit diagram showing a main part of a semiconductor device 100 according to a first embodiment of the present invention.

FIG. 1 is a circuit diagram showing a main part of a semiconductor device according to a first embodiment of the present invention.

As shown in FIG. 1, a semiconductor device 100 according to the first embodiment includes: four memory cell arrays 101 to 104; comparison circuits 111 to 114 comparing data B10 to B13, B20 to B23, B30 to B33, and B40 to B43 read respectively from the memory cell arrays 101 to 104 via data lines DL with expected values A0 to A3, respectively; and determining circuits 120 and 130 that generate determination signals S1 and S2 based on comparison results C10 to C13, C20 to C23, C30 to C33, and C40 to C43, respectively.

Each of the memory cell arrays 101 to 104 has plural word lines, plural bit lines, and plural memory cells arranged at intersections of these lines. The kind of a memory cell is not particularly limited, and a DRAM cell can be used, for example. The number of memory cell arrays is not limited to four. Four-bit data are simultaneously read from each of the memory cell arrays 101 to 104. That is, 4-bit data are simultaneously read from each of the memory cell arrays 101 to 104 in one read operation. The number of bits of data read from each of the memory cell arrays 101 to 104 in one read operation is not limited to four, and can be any number equal to or larger than two.

Figure 2:
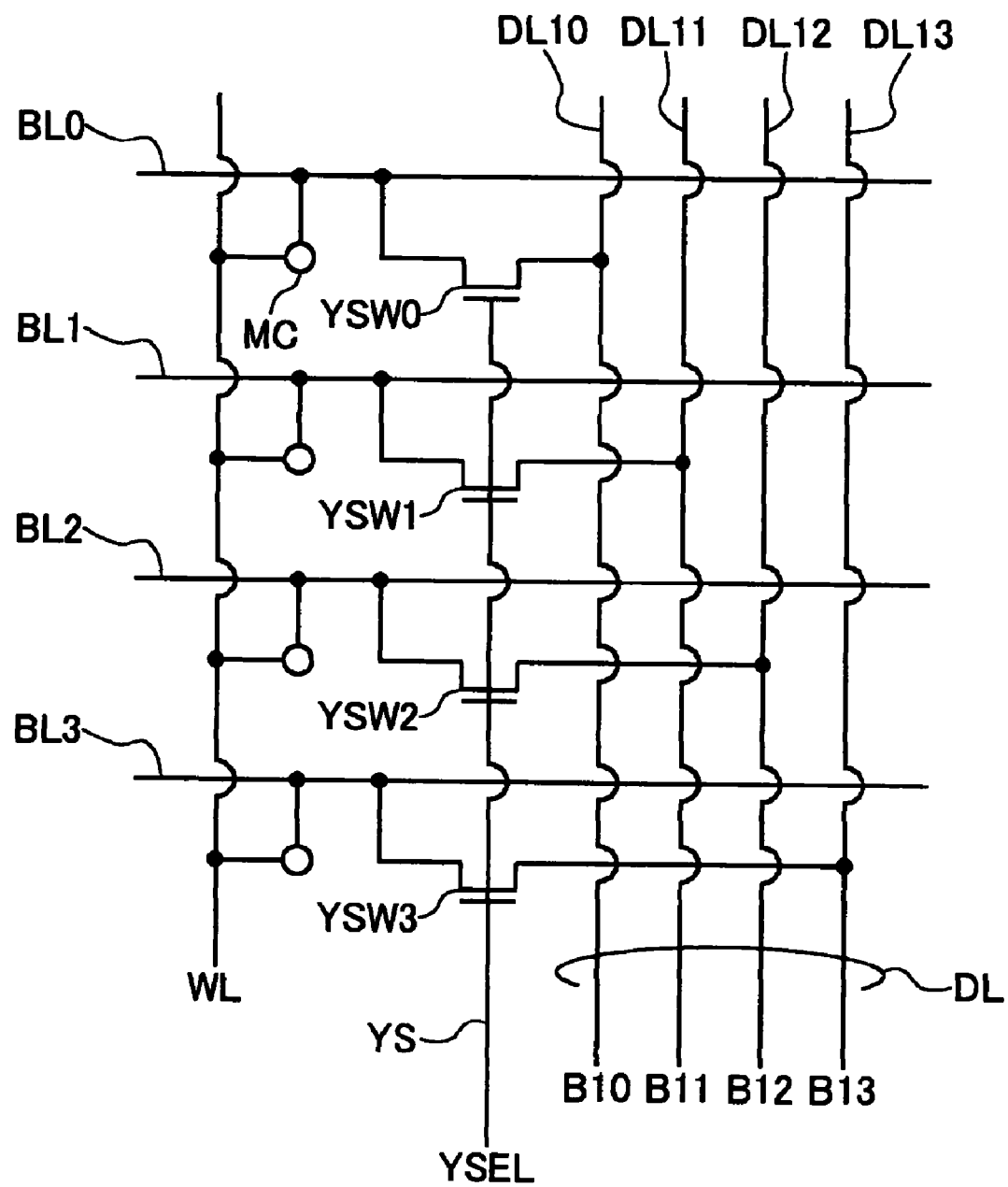
FIG. 2 is a circuit diagram showing a relationship between bit lines and data lines in a memory cell array 101.

FIG. 2 is a circuit diagram showing a relationship between bit lines and data lines in the memory cell array 101.

As shown in FIG. 2, the memory cell array 101 includes bit lines BL0 to BL3, and the bit lines BL0 to BL3 intersect a word line. Memory cells MC are arranged at intersections of the bit lines BL0 to BL3 and the word line WL, respectively. The bit lines BL0 to BL3 are connected to data lines DL10 to DL13 via column switches YSW0 to YSW3, respectively. The data lines DL10 to DL13 are a wiring group which corresponds to the data line DL shown in FIG. 1. In the first embodiment, the column switches YSW0 to YSW3 are configured by MOS transistors, and a column selection signal YSEL is supplied in common to gate electrodes of the MOS transistors via a column selection line YS. Therefore, when the column selection signal YSEL is activated after the word lines WL are activated, the bit lines BL0 to BL3 are simultaneously connected to the data lines DL10 to DL13, respectively. Therefore, 4-bit data B10 to 813 read from the memory cell array 101 in one read operation are output via the column switches YSW0 to YSW3 to which the same column selection signal YSEL is supplied.

Consequently, when the column selection line YS itself has a defect, for example and when the column selection line YS is disconnected in the middle, the 4-bit data B10 to B13 read at one time all become defective. On the other hand, when any one of the bit lines BL0 to BL3 has a defect, only read data corresponding to a bit line having the defect becomes defective. The present invention provides a semiconductor device capable of determining whether a defect included in the read data B10 to B13 is caused by a defect of the column selection line YS or by a defect of a bit line BL.

Other memory cell arrays 102 to 104 also have a similar circuit configuration, and the four memory cell arrays 101 to 104 operate simultaneously.

Referring back to FIG. 1, the data B10 to B13, B20 to B23, B30 to B33, and B40 to B43 read via the data lines DL are supplied to the comparison circuits 111 to 114, respectively. The comparison circuits 111 to 114 compare the read data B10 to B13, B20 to B23, B30 to B33, and B40 to B43 with expected values A0 to A3, respectively. The expected values A0 to A3 are supplied from a register 140, and correspond to correct values (that is, write data) of the read data B10 to B13, B20 to B23, B30 to B33, and B40 to B43.

Figure 3:
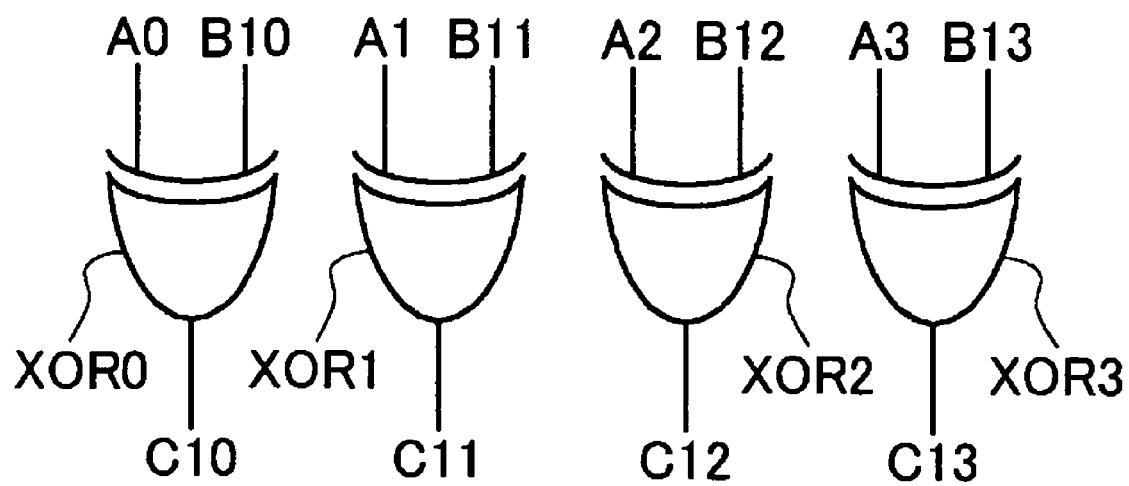
FIG. 3 is a circuit diagram of a comparison circuit 111.

FIG. 3 is a circuit diagram of the comparison circuit 111. Other comparison circuits 112 to 114 also have the same configuration as that of the comparison circuit 111.

As shown in FIG. 3, the comparison circuit 111 is configured by four exclusive OR gates XOR0 to XOR3. The expected values A0 to A3 are supplied to input ends at one side of the exclusive OR gates XOR0 to XOR3, respectively, and the read data B10 to B13 are supplied to the other input ends of the exclusive OR gates XOR0 to XOR3, respectively. Therefore, when the read data and the expected values are at the same logic level, the corresponding comparison results C10 to C13 are at a low level. On the other hand, when the corresponding read data and the expected values are at different logic levels, the corresponding comparison results C10 to C13 are at a high level.

As shown in FIG. 1, the comparison results C10 to C13 are supplied to gate electrodes of corresponding MOS transistors T10 to T13, respectively. Sources of the transistors T10 to T13 are supplied to a ground level, respectively, and drains of the transistors are supplied to an AND gate that constitutes the determining circuit 120 and to an OR gate that constitutes the determining circuit 130. As shown in FIG. 1, drains of transistors T10, T20, T30, and T40 are in wired-OR connection, and outputs of the transistors are used as a determination signal D0. Similarly, drains of transistors T11, T21, T31, and T41 are in wired-OR connection, and outputs of the transistors are used as a determination signal D1, and drains of transistors T12, T22, T32, and T42 are in wired-OR connection, and outputs of the transistors are used as a determination signal D2. Drains of transistors T13, T23, T33, and T43 are in wired-OR connection, and outputs of the transistors are used as a determination signal D3. When any of the comparison results C10 to C13, C20 to C23, C30 to C33, and C40 to C43 are activated at a high level, corresponding determination signals D0 to D3 are activated at a low level. The determination signals D0 to D3 are usually inactivated at a high level by pull-up resistors R0 to R3.

As shown in FIG. 1, the determining circuit 120 is configured by an AND gate that receives the determination signals D0 to D3. Therefore, the determination signal S1 as an output of the determining circuit 120 is at a high level (an inactive level) only when the determination signals D0 to D3 are all at a high level. When at least one of the determination signals D0 to D3 is at a low level, the determination signal S1 is at a low level (an active level). Consequently, when at least one of 16 transistors T10 to T43 shown in FIG. 1 is ON, the determination signal S1 is activated at a low level. This means that 16-bit comparison results C10 to C13, C20 to C23, C30 to C33, and C40 to C43 by the comparison circuits 111 to 114 are compressed to the determination signal S1 in one bit. The determination signal S1 is used as a signal indicating which one of bit lines is defective. When a defect is found, a bit line having the defect is specified by using a circuit (not shown), and this is replaced by an auxiliary bit line.

Meanwhile, the determining circuit 130 is configured by an OR gate that receives the determination signals D0 to D3. Therefore, the determination signal S2 as an output of the determining circuit 130 is at a low level (an active level) only when the determination signals D0 to D3 are all at a low level. When at least one of the determination signals D0 to D3 is at a high level, the determination signal S2 is at a high level (an inactive state). Consequently, when the transistors T10 to T13 that correspond to the memory cell array 101 are all ON, for example, the determination signal S2 is activated at a low level. This means that all read data relevant to the column selection signal YSEL activated in one of the memory cell arrays 101 to 104 are defective. Therefore, it is clear that the bit line is not defective but the column selection line YS is defective. That is, the determination signal S2 is used to indicate whether the column selection line YS is defective. When the determination signal S2 is activated, which one of the memory cell arrays 101 to 104 the defective column selection line YS belongs to is not clear at this stage, and it is not necessarily required to test this. This is because a chip having the defective column selection line YS is discarded.

As explained above, according to the first embodiment, when any one of the bit lines BL is defective, the determination signal S1 is activated. When the column selection line YS is defective, the determination signal S2 is activated. That is, because a defect of the column selection line YS can be detected by evaluating plural pieces of read data in an operation test performed in a wafer state, a chip including this defect can be discarded before packaging.

However, although is a very rare case, when the comparison result C10 that corresponds to the memory cell array 101 is at a high level (indicating a mismatch) and also when comparison results C21 to C23 that correspond to the memory cell array 102 are at a high level (indicating a mismatch) due to a defect of a bit line, for example, the transistors T10 and T21 to T23 are turned ON. Therefore, the determination signal S2 is activated at a low level. That is, even when a bit line is defective, there is a possibility that the column selection line YS is determined as defective, depending on a combination of plural bit lines having the defective bit line. An example where such a rare case can be eliminated is explained as a second embodiment of the present invention.

Figure 4:
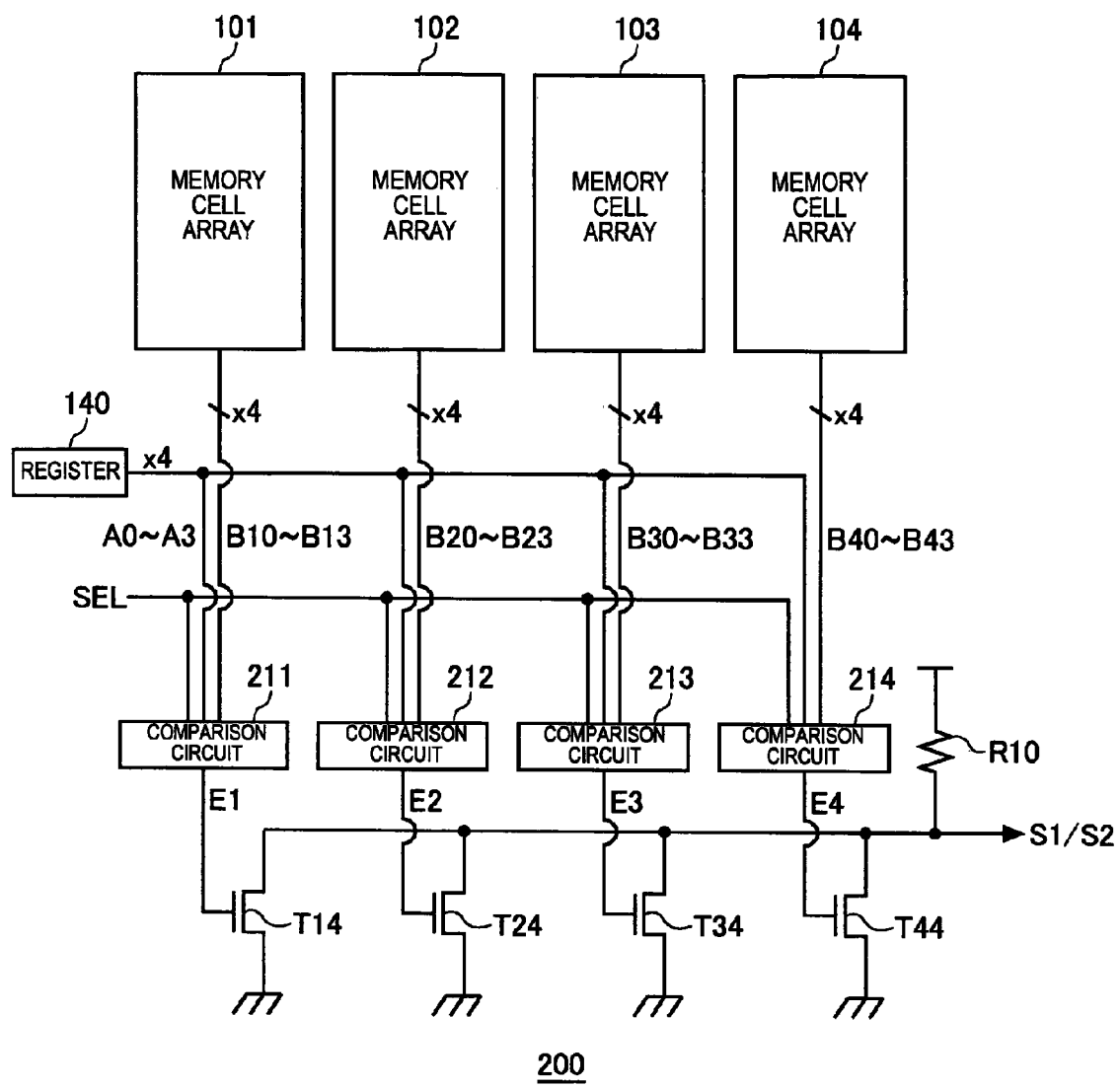
FIG. 4 is a circuit diagram showing a main part of a semiconductor device 200 according to a second embodiment of the present invention.

FIG. 4 is a circuit diagram showing a main part of a semiconductor device according to the second embodiment. Like constituent elements in the semiconductor device according to the second embodiment are denoted by like reference numerals as those in the semiconductor device 100 shown in FIG. 1, and redundant explanations thereof are omitted.

As shown in FIG. 4, a semiconductor device 200 according to the second embodiment has comparison circuits 211 to 214 allocated to the four memory cell arrays 101 to 104, respectively. Determination signals E1 to E4 as outputs of the comparison circuits 211 to 214 are supplied to gate electrodes of transistors T14, T24, T34, and T44, respectively. Sources of the transistors T14, T24, T34, and T44 are connected to a ground level, respectively, and drains of the transistors are connected in common to a pull-up resistor R10. That is, the transistors T14, T24, T34, and T44 constitute a wired-OR circuit, and an output of the circuit is used as the determination signal S1 or S2.

Figure 5:
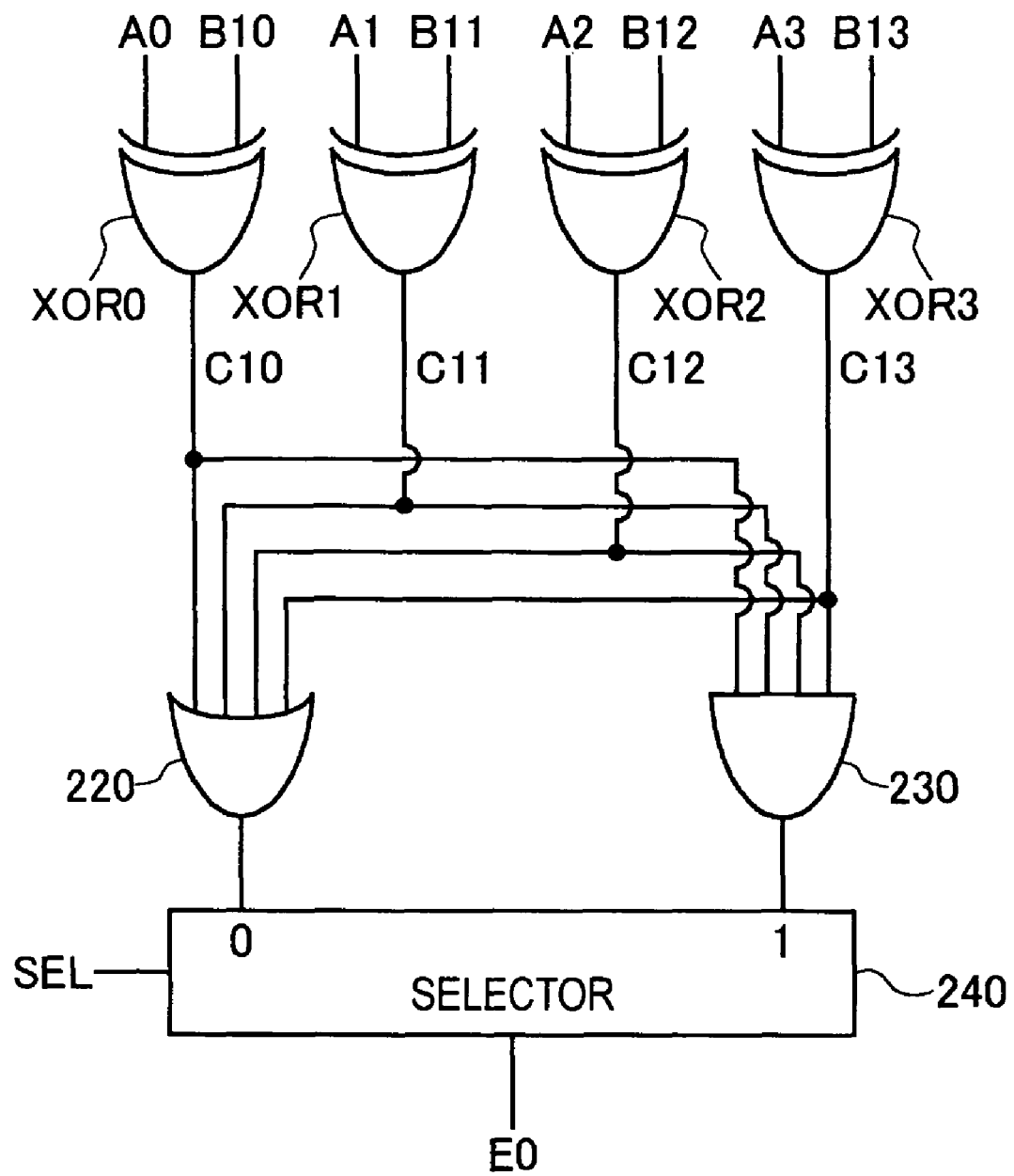
FIG. 5 is a circuit diagram of a comparison circuit 211.

FIG. 5 is a circuit diagram of the comparison circuit 211. Other comparison circuits 212 to 214 also have the same configuration as that of the comparison circuit 211.

As shown in FIG. 5, the comparison circuit 211 is configured by four exclusive OR gates XOR0 to XOR3, an OR gate 220 and an AND gate 230 that receive the comparison results C10 to C13 of the exclusive OR gates XOR0 to XOR3, and a selector 240 that selects an output of the OR gate 220 and the AND gate 230. The selector 240 performs a selection based on a selection signal SEL.

According to the second embodiment, a determining circuit that determines which one of bit lines is defective is configured by the OR gate 220, and a determining circuit that determines whether the column selection line YS is defective is configured by the AND gate 230. That is, when a bit line is defective, at least one of the comparison results C10 to C13 is activated at a high level. Therefore, an output of the OR gate 220 is activated at a high level. Consequently, when an input node 0 at an OR gate 220 side is selected by the selection signal SEL, the transistor T14 is turned ON by the determination signal E1. Therefore, the determination signal S1 is activated at a low level. On the other hand, when the column selection line YS is defective, all the comparison results C10 to C13 can be activated at a high level. Therefore, an output of the AND gate 230 can be activated at a high level. In this case, the transistor T14 is turned ON by the determination signal E1 when an input node 1 at an AND gate 230 side is selected by the selection signal SEL. Therefore, the determination signal S2 is activated at a low level.

As explained above, according to the second embodiment, whether a bit line is defective or whether a column selection line is defective is determined for each of the memory cell arrays 101 to 104. Therefore, the possibility that a bit line defect is mistakenly determined as a column selection defect becomes low.

When there is a defect on the column selection line YS, such as when the column selection line YS is disconnected, for example, gate electrodes of the column switches YSW0 to YSW3 are in a floating state. Therefore, the conduction state of the column switches YSW0 to YSW3 is unstable in this case. Consequently, not all the comparison results C10 to C13 necessarily simultaneously are at a high level (a mismatch) in the memory cell arrays. Therefore, when it is assumed that all the comparison results C10 to C13 simultaneously are at a high level, there is a possibility that a defect of the column selection line YS is overlooked. An example where such a rare case can be eliminated is explained as a third embodiment of the present invention.

Figure 6:
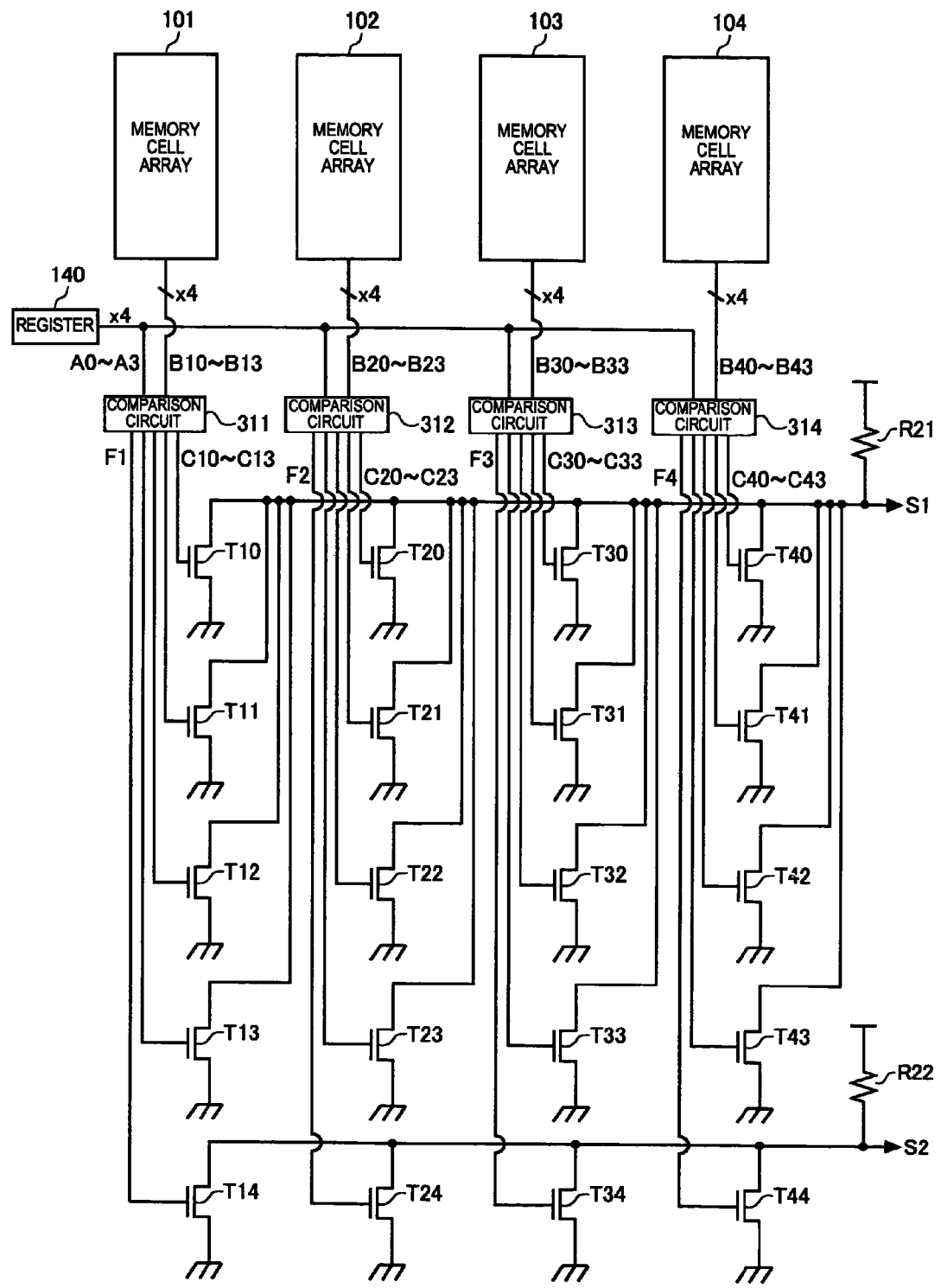
FIG. 6 is a circuit diagram showing a main part of a semiconductor device 300 according to a third embodiment of the present invention.

FIG. 6 is a circuit diagram showing a main part of a semiconductor device according to the third embodiment. Like constituent elements in the semiconductor device according to the third embodiment are denoted by like reference numerals as those in the semiconductor devices 100 and 200 shown in FIGS. 1 and 4, respectively, and redundant explanations thereof are omitted.

As shown in FIG. 6, a semiconductor device 300 according to the third embodiment has comparison circuits 311 to 314 allocated to the four memory cell arrays 101 to 104, respectively. The comparison circuits 311 to 314 output the comparison results C10 to C13, C20 to C23, C30 to C33, and C40 to C43, respectively in a similar manner to that of the comparison circuits 111 to 114 shown in FIG. 1, and also output determination signals F1 to F4, respectively. The comparison results C10 to C13, C20 to C23, C30 to C33, and C40 to C43 are supplied to gate electrodes of the corresponding transistors T10 to T13, T20 to T23, T30 to T33, and T40 to T43, respectively. The determination signals F1 to F4 are supplied to gate electrodes of corresponding transistors T14, T24, T34, and T44, respectively. Sources of the transistors T10 to T13, T20 to T23, T30 to T33, and T40 to T43 are supplied to a ground level, respectively, and drains of the transistors are connected in common to a pull-up resistor R21. That is the transistors T10 to T13, T20 to T23, T30 to T33, and T40 to T43 constitute a wired-OR circuit, and an output of the circuit is used as the determination signal S1. Sources of the transistors T14, T24, T34, and T44 are also connected to a ground level, respectively, and drains of the transistors are connected in common to a pull-up resistor R22. That is, the transistors T14, T24, T34, and T44 constitute a wired-OR circuit, and an output of the circuit is used as the determination signal S2.

Figure 7:
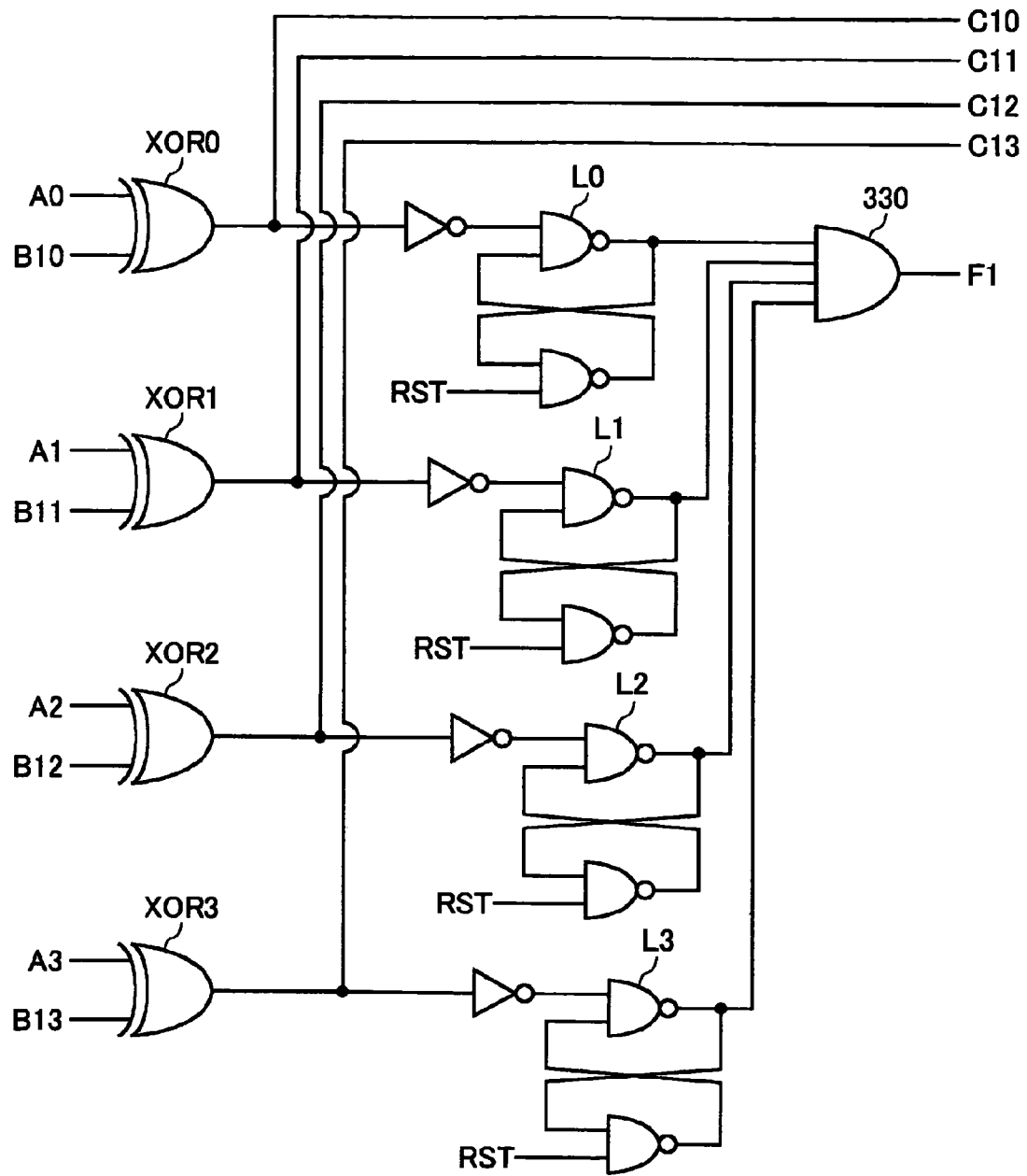
FIG. 7 is a circuit diagram of a comparison circuit 311.

FIG. 7 is a circuit diagram of the comparison circuit 311. Other comparison circuits 312 to 314 also have the same configuration as that of the comparison circuit 311.

As shown in FIG. 7, the comparison circuit 311 is configured by four exclusive OR gates XOR0 to XOR3, SR latch circuits L0 to L3 set by the comparison results C10 to C13 as outputs of the exclusive OR gates XOR0 to XOR3, and an AND gate 330 that receive outputs of the SR latch circuits L0 to L3. An output of the AND gate 330 is used as the determination signal F1. The SR latch circuits L0 to L3 are reset by a reset signal RST activated each time when the column selection signal YSEL is switched.

In the above configuration, the determination signal F1 is activated at a high level when all the comparison results C10 to 013 are at a high level at least once, before the reset signal RST is activated next after the reset signal RST is activated, even when all the comparison results C10 to C13 do not simultaneously are at a high level. In this manner, when a conduction state of the column switches YSW0 to YSW3 is unstable such as when the column selection line YS is disconnected, this can be detected.

Figure 8:
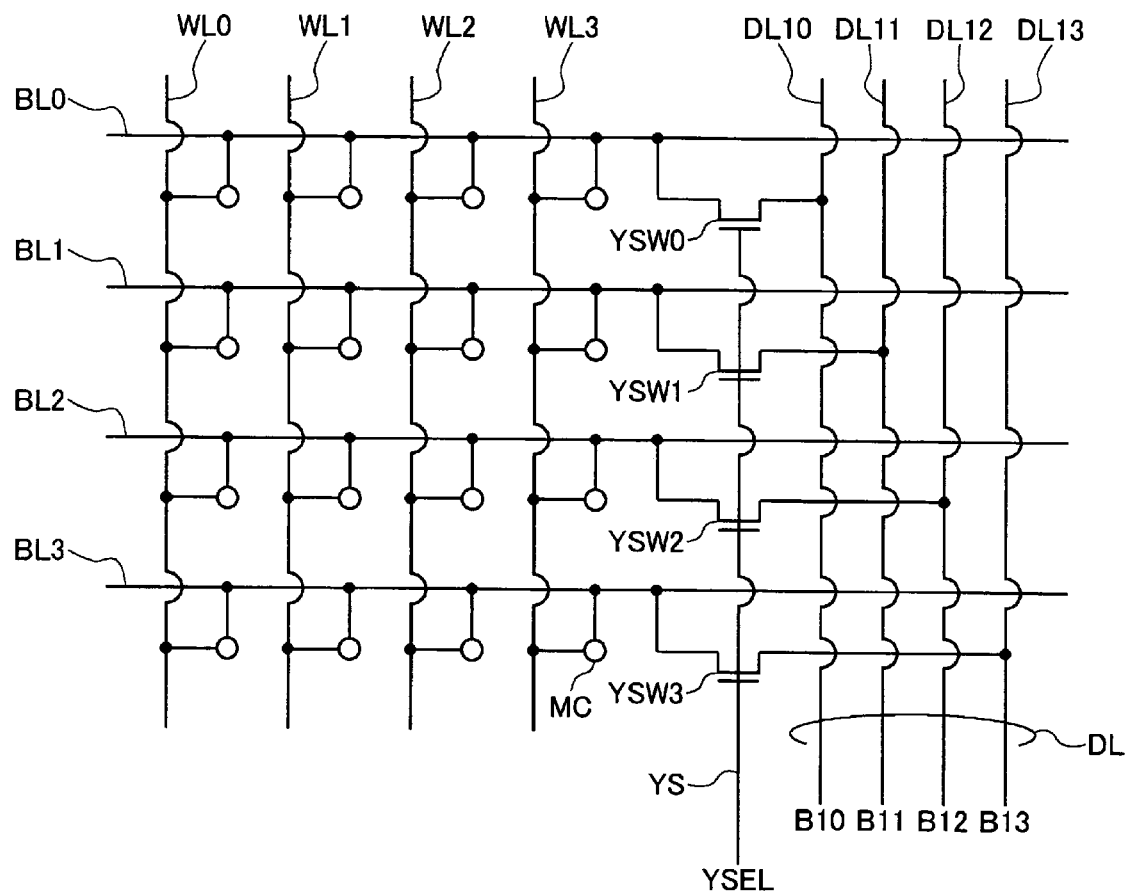
FIG. 8 is a circuit diagram showing a relationship among word lines, bit lines, and data lines in a memory cell array 101.

That is, as shown in FIG. 8, to assume a case where an operation test is performed by sequentially selecting the word lines WL0 to WL3 that intersect the bit lines BL0 to BL3, when a result shown in FIG. 9A is obtained for example, all of the SR latch circuits L0 to L3 are in a set state after selecting the word line WL2. Because the determination signal F1 is at a high level in this case, the determination signal S2 is activated at a low level. In an example shown in FIG. 9A, all the comparison results C10 to C13 do not simultaneously become at a high level even when the word lines WL0 to WL3 are sequentially selected. However, because this defect pattern often appears when the column switches YSW0 to YSW3 are in an unstable state, it can be determined that the column selection line YS is defective. In this manner, in the third embodiment, a defect of the column selection line YS can be detected even when the comparison results C10 to C13 are not simultaneously at a high level.

Needless to mention, as shown in FIG. 9B, when all the comparison results C10 to C13 are at a high level after the word line WL0 is selected, the SR latch circuits L0 to L3 all become in a set state, and thus the determination signal S2 is activated at a low level.

On the other hand, as shown in FIGS. 9C and 9D, when there is a comparison result which does not become at a high level even when the word lines WL0 to WL3 are sequentially selected, the determination signal F1 maintains a low level. As shown in FIGS. 9C and 9D, even if many mismatches are detected, when any mismatch is not detected in read data from any of the data lines DL10 to DL13, it can be determined that a bit line is defective and the column selection line YS is not defective. In the third embodiment, this bit line defect is not mistakenly determined as a defect of the column selection line YS.

It is apparent that the present invention is not limited to the above embodiments, but may be modified and changed without departing from the scope and spirit of the invention.

What is claimed is:

1. A semiconductor device comprising:
   a comparison circuit that generates a plurality of comparison result signals by comparing a plurality of read data simultaneously read via a plurality of data lines with expected values, respectively;
   a first determining circuit that activates a first determination signal when at least one of the comparison result signals indicates a mismatch; and
   a second determining circuit that activates a second determination signal when all the comparison result signals indicate a mismatch.

2. The semiconductor device as claimed in claim 1, wherein the second determining circuit activates the second determination signal when all the comparison result signals simultaneously indicate a mismatch.

3. The semiconductor device as claimed in claim 1, wherein the second determining circuit activates the second determination signal when each of the comparison result signals indicates a mismatch at least once when the comparison circuit performs a plurality of comparison operations to the data lines.

4. The semiconductor device as claimed in claim 1, further comprising a plurality of switch circuits that supply the read data to corresponding ones of the data lines, respectively,
   wherein the switch circuits are controlled by a same control signal.

5. A semiconductor device comprising:
   at least one word line;
   a plurality of memory cells selected by the word line;
   a plurality of bit lines connected to the memory cells, respectively;
   a plurality of data lines;
   a plurality of column switches that connect the bit lines and the data lines, respectively;
   a column selection line that supplies a column selection signal in common to the column switches; and
   a determining circuit that determines a defect of the column selection line by evaluating a plurality of data on the data lines by activating the word line and the column selection signal.

6. The semiconductor device as claimed in claim 5, further comprising a comparison circuit that generates a plurality of comparison result signals that correspond to read data, respectively by comparing the read data with a plurality of expected values, respectively,
   wherein the determining circuit determines a defect of the column selection line based on the comparison result signals.

7. The semiconductor device as claimed in claim 6, wherein the determining circuit determines that the column selection line is defective when all the comparison result signals indicate a mismatch.

8. The semiconductor device as claimed in claim 7, wherein the determining circuit determines that the column selection line is defective when all the comparison result signals that correspond to the read data simultaneously read from the memory cells by activating the word line indicate a mismatch.

9. The semiconductor device as claimed in claim 7, wherein a plurality of the word lines are provided, and
   the determining circuit sequentially determines comparison result signals by sequentially activating a different one of the word lines, and determines that the column selection line is defective when each of the comparison result signals that corresponds to each data line indicates a mismatch at least once.

10. The semiconductor device according to claim 5, wherein the column switches each comprise a Metal-Oxide Semiconductor (MOS) transistor.

11. The semiconductor device according to claim 10, wherein the column selection signal is supplied on common to gate electrodes of the MOS transistors of the column switches.

12. The semiconductor device according to claim 5, further comprising a register that stores a plurality of expected values,
   wherein the determining circuit determines the defect of the column selection line based on a comparison between the expected values and the data on the data lines, respectively.

13. The semiconductor device according to claim 12, further comprising a plurality of exclusive OR gates, each exclusive OR gate comprising:
   a first input that receives the data on a data line;
   a second input that receives a respective expected value from the register; and
   an output that outputs a logic result to the determining circuit.

14. The semiconductor device according to claim 13, wherein the determining circuit comprises an AND gate and an OR gate, each receiving the logic result from each exclusive OR gate.

15. The semiconductor device according to claim 14, wherein, when the OR gate outputs a logic high, the determining circuit determines that the column selection line has the defect.

16. The semiconductor device according to claim 14, wherein, when the AND gate outputs a logic high, the determining circuit determines that at least one of the bit lines has a defect.

17. A semiconductor device comprising:

a memory cell array including a plurality of memory cells;

a plurality of data lines electrically coupled to the memory cell array to receive a plurality of read data signals from the memory cell array, respectively;

a register temporarily storing a plurality of expected data signals;

a plurality of comparators electrically coupled to the data lines and the register to compare the read data signals with the expected data signals, respectively, each of the comparators producing a comparison signal that takes a first logic level when an associated one of the read data signals is coincident with an associated one of the expected data signals and a second logic level when the associated one of the read data signals is in coincident with the associated one of the expected data signals; and a first logic gate coupled to the comparators to produce a first output signal that takes one of the first and second logic levels in response to each of the comparison signals taking the second logic level and takes the other of the first and second logic levels in response to at least one of the comparison signals taking the first logic level.

18. The semiconductor device as claimed in claim 17, further comprising a second logic gate coupled to the comparators to produce a second output signal that takes the other of the first and second logic levels in response to each of the comparison signals taking the first logic level and the one of the first and second logic levels in response to at least one of the comparison signals taking the second logic level.

19. The semiconductor device as claimed in 18, wherein the first logic gate performs a logical sum operation and the second logic gate performs a logical product operation.

20. The semiconductor device as claimed in 18, wherein the first logic gate performs a logical product operation and the second logic gate performs a logical sum operation.

* * * * *